US007130365B2

(12) United States Patent
Li

(10) Patent No.: US 7,130,365 B2
(45) Date of Patent: Oct. 31, 2006

(54) BASEBAND PROCESSING METHOD BASED ON SMART ANTENNA AND INTERFERENCE CANCELLATION

(75) Inventor: Feng Li, Beijing (CN)

(73) Assignee: China Academy of Telecommunications Technology, Beijing (CN)

( * ) Notice: Subject to any disclaimer, the term of this patent is extended or adjusted under 35 U.S.C. 154(b) by 649 days.

(21) Appl. No.: 10/073,709

(22) Filed: Feb. 11, 2002

(65) Prior Publication Data

US 2002/0111143 A1 Aug. 15, 2002

Related U.S. Application Data

(63) Continuation of application No. PCT/CN00/00169, filed on Jun. 22, 2000.

(30) Foreign Application Priority Data

Aug. 10, 1999 (CN) ................................ 99 1 11349

(51) Int. Cl.
*H03D 1/04* (2006.01)

(52) U.S. Cl. ...................................................... 375/346

(58) Field of Classification Search ................ 375/260, 375/267, 285, 346–350, 144, 148, 340, 343, 375/355, 358; 370/335, 342; 455/504, 506, 455/63.1, 67.1, 132–137, 296
See application file for complete search history.

(56) References Cited

U.S. PATENT DOCUMENTS 5,621,752 A * 4/1997 Antonio et al. ............. 375/144
5,982,327 A * 11/1999 Vook et al. ................. 342/380
6,141,393 A * 10/2000 Thomas et al. ............. 375/347
6,188,718 B1 * 2/2001 Gitlin et al. ................ 375/148
6,301,470 B1 * 10/2001 Brunner et al. .......... 455/278.1
6,314,147 B1 * 11/2001 Liang et al. ................ 375/346
6,351,499 B1 * 2/2002 Paulraj et al. .............. 375/267
6,567,462 B1 * 5/2003 Brunner et al. ............. 375/148
6,597,678 B1 * 7/2003 Kuwahara et al. .......... 370/342

FOREIGN PATENT DOCUMENTS

| | | |
|---|---|---|
| CN | 1053313 C | 11/1997 |
| CN | 1220562 A | 3/1999 |
| EP | 647 979 | 4/1995 |
| EP | 899 894 | 3/1999 |
| WO | WO 95/22210 | 8/1995 |

* cited by examiner

*Primary Examiner*—Khanh Tran
(74) *Attorney, Agent, or Firm*—Alston & Bird LLP

(57) ABSTRACT

This invention discloses a baseband processing method based on smart antenna and interference cancellation. The method includes the steps of: A. making a channel estimation to get a channel response; B. picking up useful symbolic level signals from received digital signals by smart antenna beam forming based on the channel estimation of step A; C. reconstructing the useful symbolic level signals and adding a scrambling code to get the chip level reconstructed signal; D. subtracting the reconstructed signal from the received digital signal; and E. executing steps B to D repeatedly to recover signals for all users. The method of the invention can solve problems associated with interference of multi-path propagation in CDMA systems with smart antennas with better results.

20 Claims, 3 Drawing Sheets

BASEBAND PROCESSING METHOD BASED ON SMART ANTENNA AND INTERFERENCE CANCELLATION

CROSS REFERENCE TO RELATED APPLICATION

This is a continuation application of PCT/CN00/00169 filed Jun. 22, 2000, incorporated herein by reference in its entirety.

FIELD OF THE TECHNOLOGY

The present invention relates generally to interference signal cancellation technology used in base stations of wireless communication systems having smart antennas, and more particularly to a baseband processing method based on smart antenna and interference cancellation.

BACKGROUND OF THE INVENTION

In modem wireless communication systems, especially in CDMA (Code Division Multiple Access) wireless communication systems, in order to increase system capacity, system sensitivity and communication distances with lower emission power, smart antennas are generally used.

The Chinese patent named "Time Division Duplex Synchronous Code Division Multiple Access Wireless Communication System with Smart Antenna" (CN 97 1 04039.7) discloses a base station structure for a wireless communication system with smart antennas. The base station includes an antenna array consisting of one or more antenna units, corresponding radio frequency feeder cables and a set of coherent radio frequency transceivers. Each antenna unit receives signals from user terminals. The antenna units direct the space characteristic vectors and directions of arrival (DOA) of the signals to a baseband processor. The processor then implements receiving antenna beam forming using a corresponding algorithm. Among them, any antenna unit, corresponding feeder cable and coherent radio frequency transceiver together is called a link. By using weight getting from the up link receiving beam forming of each link in the down link transmitting beam forming, the entire functionality of smart antennas can be implemented, under symmetrical wave propagation conditions.

A primary aspect of modern wireless communication systems is mobile communication. Mobile communication works within a complex and variable environment (reference to ITU proposal M1225). Accordingly severe influences of time-varying and multipath propagation must be considered. The Chinese patent referenced above as well as many technical documents concerning beam forming algorithms of smart antennas conclude increased functionality will result with increased algorithm complexity. Nevertheless, under a mobile communication environment, beam forming must be completed in real time, and algorithm-completion time is at a microsecond level. As another limitation of modern microelectronic technology, digital signal processing (DSP) or application specific integrated circuits (ASIC) cannot implement highly complex real time processing within such short time periods. Faced with this conflict, within a mobile communication environment, simple and real time algorithms for smart antennas not only cannot solve the multipath propagation problem, but also cannot thoroughly solve system capacity problems of CDMA mobile communication systems.

Technologies such as the Rake receiver and Joint Detection or Multi User Detection have been widely studied for use in CDMA mobile communication systems in an attempt to solve the interference problems associated with multipath propagation. Nevertheless, neither the Rake receiver nor multiuser detection technology can be directly used in mobile communication systems with smart antennas. Multiuser detection technology processes the CDMA signals of multiple code channels, after channel estimation and matched filter, and all user data are solved at the same time using an inverse matrix. However smart antenna technology makes beam forming for each code channel separately, and so it is difficult to take advantage of the diversity provided by user multipath technology. Rake receiver technology composes user main multipath components, but it also destroys the phase relationship between antenna units of an antenna array. Another limitation of Rake receiver technology is that the user number is the same as the spread spectrum coefficient, which makes it impossible to work under full code channel circumstances.

There is a two-dimensional smart antenna technology, but it is in a research stage and its algorithm is immature and complex.

There is another method which processes multiuser detection after using smart antenna; but at this time as each code channel has been separated, processing must be separated for each code channel. As a result this technology not only cannot fully bring multiuser detection function into play, but it also greatly increases the complexity of baseband signal processing.

SUMMARY OF THE INVENTION

In order to increase system capacity and provide better performance for CDMA wireless communication systems, it is necessary to provide a simple and real time interference cancellation method convenient for use in CDMA wireless communications based on smart antennas.

Therefore, an object of the invention is to provide a baseband processing method based on smart antenna and interference cancellation. By designing a new digital signal processing method, CDMA mobile communication systems or other wireless communication systems, which use the method, can use smart antennas and solve multipath propagation interference at the same time.

A further object of the invention is to provide a set of new digital signal processing methods, which can be used in CDMA mobile communication systems or other wireless communication systems, and can solve various multipath propagation interference problems while using smart antennas.

The invention of a baseband processing method based on smart antenna and interference cancellation comprises the steps of:

A. with a known user training sequence, taking sampled-data output signals from link antenna units and radio frequency transceivers of a communication system to make channel estimations, and then getting all users responses on all channels;

B. picking up useful symbolic level signals from the sampled-data output signals, based on the channel estimation, using smart antenna beam formation;

C. reconstructing signals with the useful symbolic level signals, and adding a scramble code, then getting chip level reconstructed signals;

D. subtracting the reconstructed signals from the sampled-data output signals; and E. executing steps B to D repeatedly until recovering all user signals.

Step A is done by a channel estimation module, and the channel response includes a matrix, which is related to each user training sequence and is calculated and stored beforehand.

Step B includes: making a power estimation of the response for all users on all channels with a power estimation module, calculating all users main paths and multipath power distributions within a searching window; sending calculated power distributions to signal generators to generate signals, which includes: calculating each user's maximum peak value power position, storing this peak value power position in a power point and getting de-spread results of all signals at the power point with a smart antenna algorithm.

When calculating each user's maximum peak value power position, an adjustment parameter for synchronization is sent to a transmitting module of that user with the most powerful path not at the same point of other users and without synchronization with the base station.

Step B further comprises: sending the de-spread results to a signal/noise ratio estimation module simultaneously, estimating all users signal/noise ratios, executing steps C, D, E continuously for users with a low signal/noise ratio and outputting the signal results directly for users with a high signal/noise ratio.

Estimating the user signal/noise ratio comprises: calculating user power; deciding the user power greater than a certain threshold as effective power; calculating the variance for all signals with an effective power at their corresponding constellation map point; deciding those users with a low signal/noise ratio if their variance is greater than a preset value, and those users with a high signal/noise ratio if their variance is less than a preset value.

Step C reconstructs an original signal in a signal reconstructing module and calculates the components of all users' signals and multipath on each antenna unit.

Step D cancels interference in an interference cancellation module.

Step E is executed in a decision module, until the number of interference cancellation loops reaches a preset number, which is less than or equal to the length of a searching window, then stops interference cancellation and outputs the recovered signals.

Step E is executed in a decision module, until the signal/noise ratio of all signals is greater than a set threshold, then stops interference cancellation and outputs recovered signals.

Step E executes steps B to D repeatedly with an at most repeated number equal to the length of the searching window.

It is essential to the invention that beam forming of every multipath within a searching window length is done for every channel, and useful signals are selected and accumulated so as to utilize the advantages of space diversity and time diversity. In this way even under conditions of severe multipath interference and white noise interference, better results can be achieved. The calculation volume of the method is limited and can be implemented with commercial chips such as digital signal processors (DSP) or field programmable gate arrays (FPGA).

The method of present invention is particularly useful for wireless communication systems of code division multiple access including time division duplex (TDD) and frequency division duplex (FDD).

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
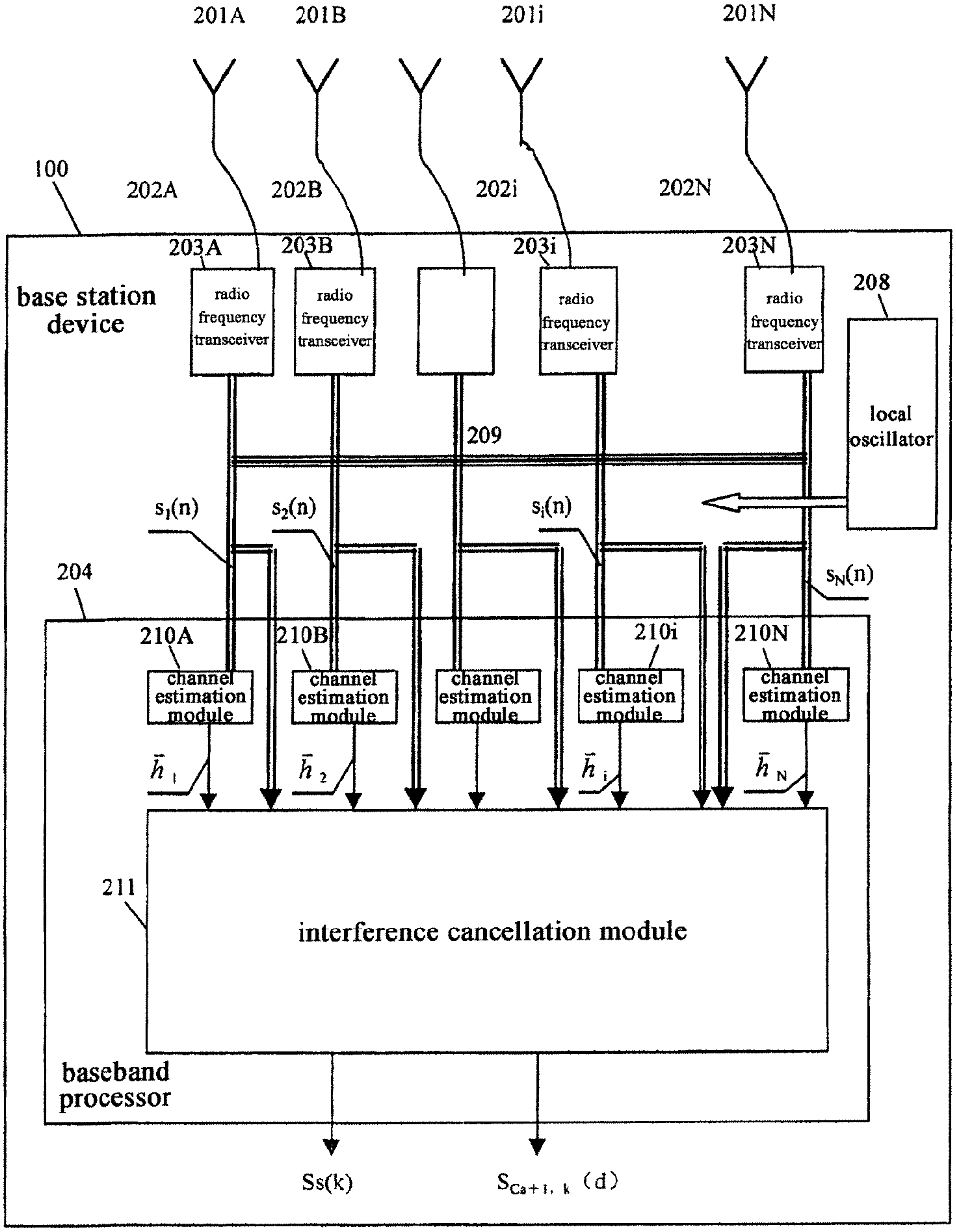
FIG. 1 is base station structure diagram of wireless communication with smart antenna.

The present invention is useful with mobile communication systems having smart antennas and inference cancellation or wireless communication systems such as wireless user loop systems. FIG. 1 shows a base station structure of one such system. The base station includes N identical antenna units 201A, 201B, . . . , 201*i*, . . . , 201N; N substantially identical feeder cables 202A, 202B, . . . , 202*i*, . . . , 202N; N radio frequency transceivers 203A, 203B, . . . , 203*i*, . . . , 203N; and a baseband processor 204. All transceivers 203 use the same local oscillator 208 to guarantee that each radio frequency transceiver works in coherence. Each radio frequency transceiver includes Analog to Digital Converters (ADC) and Digital to Analog Converters (DAC), so that all baseband input and output for the radio frequency transceivers 203 are digital signals. The radio frequency transceivers are connected to the baseband processor by a high speed digital bus 209. In FIG. 1, block 100 shows the base station devices.

The invention only discusses interference cancellation of receiving signals in baseband processing as shown in FIG. 1, without considering transmitting signal processing. Smart antenna implementation and interference cancellation is performed in baseband processor 204.

As an example, assume that the CDMA wireless communication system has K designed channels, and the smart antenna system consists of N antenna units, N feeder cables and N radio frequency transceivers, i. e. N links. In each receiving link, after sampling by ADC in a radio transceiver, the output digital signals are $S_1(n)$, $S_2(n)$, . . . , $S_i(n)$, . . . , $S_N(n)$, where n is the $n^{th}$ chip. Taking the $i^{th}$ receiving link as an example, after sampling its receiving signal by ADC in radio frequency transceiver 203*i*, the output digital signal is $S_i(n)$, which is the input signal for baseband processor 204. Baseband processor 204 includes channel estimation modules 210A, 210B, . . . , 210*i*, . . . , 210N, which correspond to N radio frequency transceivers 203A, 203B, . . . , 203*i*, . . . , 203N of N links, respectively, and smart antenna interference cancellation module 211. Output digital signals of N links $S_i(n)$, $S_2(n)$, . . . , $S_i(n)$, . . . , $S_N(n)$ are sent to channel estimation modules 210A, 210B, . . . , 210*i*, . . . , 210N, respectively. The output digital signals are also sent to smart antenna interference cancellation module 211. Channel response signals $\vec{h}_1, \vec{h}_2, \ldots \vec{h}_i, \ldots \vec{h}_N$ which correspond to the outputs of channel estimation modules

210A, 210B, . . . , 210*i*, . . . , 210N, respectively, are sent to smart antenna interference cancellation module 211. Smart antenna inference cancellation module 211 outputs synchronous adjustment parameter $S_S(K)$ to a down link transmitting module and outputs the interference cancellation result $S_{ca+1,k}(d)$ to a channel decode module, where $\vec{h}_i=[h_{i,1}, h_{i,2}, \ldots, h_{i,k}]$.

When $S_i(n)$ enters channel estimation module 210*i*, with a predetermined training sequence (Pilot or Midamble), K channels are estimated and K channels pulse response $h_{i,k}$ are calculated, where i is the $i^{th}$ antenna unit and k is the $k^{th}$ channel.

The specific processing procedure is as follows. Assuming that a $k^{th}$ user's known training sequence is $m_k$, and the training sequence received from the $i^{th}$ antenna is $e_i$, then the formula (1) below is used:

$$e_i(n)=\sum_{k=1}^{K}\sum_{w=1}^{W}m_k(n-w+1)h_{i,k}(w)+n_{oi} \tag{1}$$

where n is the $n^{th}$ chip, w is the length of the searching window and $n_{oi}$ is white noise received from the $i^{th}$ antenna. Formula (1) can be further rewritten as formula (2):

$$e_i=Gh_{i,k}+n_{oi} \tag{2}$$

and then, channel estimation can be shown as formula (3):

$$h_{i,k}=(G^{*T}G)^{-1}G^{*T}e_i=M_{li} \tag{3}$$

where M is a matrix, which only relates with every user training sequence and can be calculated and stored in advance, as channel estimation will be greatly increased when it is unnecessary to calculate it in real time.

According to the procedure above, the responses of all users in all channels can be calculated, respectively, and the results $h_{i,k}$ are inputted to a smart antenna inference cancellation module 211. After further processing, all user signals will be recovered.

Figure 2:
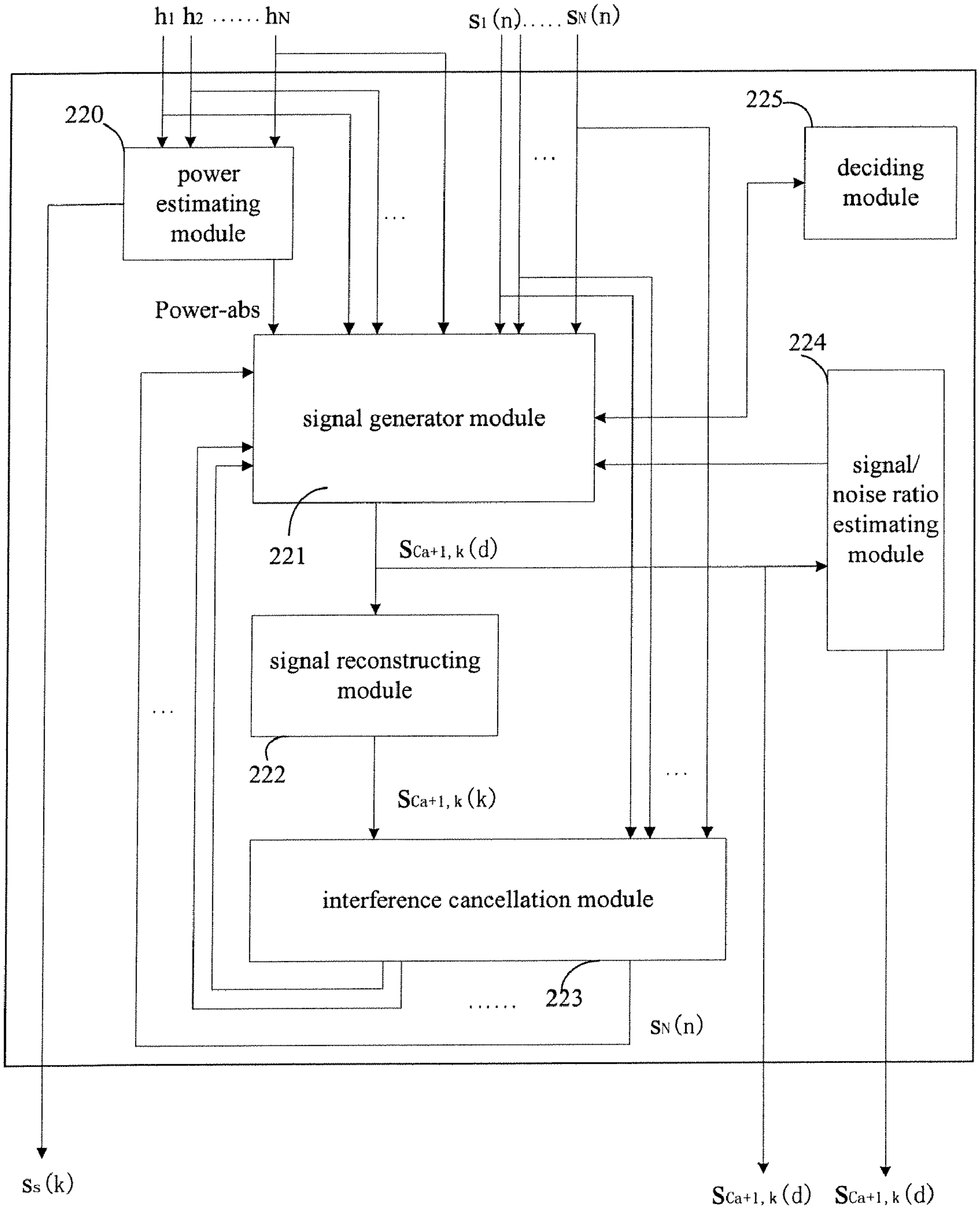
FIG. 2 is an implementing skeleton diagram of smart antenna and interference cancellation method.

FIG. 2 illustrates interference cancellation processing of a smart antenna interference cancellation module 211. First, a channel response $h_{i,k}$, calculated by channel estimation module 210*i*, is sent to a power estimation module 220 to estimate power. The main path and multipath power distribution of K users (with K channels) in a searching window are calculated, as shown with formula (4):

$$\text{power\_user}_k(m)=\sum_{i=1}^{N}\text{abs}(h_{i,k}(m)) \tag{4}$$

Then, the maximum peak power point of each user is calculated. If a user's most powerful path is not at the same point of the most powerful path of other users, then the user does not synchronize with the base station. The base station will inform the user in a down link channel to adjust in order to synchronize with other users. The adjustment parameter is $S_S(K)$ as noted above.

Then, a $k^{th}$ user main path and multipath total power distribution in a searching window is calculated, as is shown with formula (5):

$$\text{power\_abs}(m)=\sum_{i=1}^{N}\sum_{k=1}^{K}\text{abs}(h_{i,k}(m)) \tag{5}$$

where m is a point in the searching window, and the power_abs is sent to a signal generator 221 to generate a signal. At the same time, signals, sent to signal generator 221, also have channel response signals $\vec{h}_1, \vec{h}_2, \ldots \vec{h}_i, \ldots \vec{h}_N$ (vector), outputted by each channel estimation module 210A, 210B, . . . , 210*i*, . . . , 210N, respectively, and output digital signals $S_1(n)$, $S_2(n)$, ., $s_i(n)$, . . . , $s_N(n)$ of N links.

In signal generator 221, first, a position of peak value point in power_abs is calculated and stored in power_point. At the same time, set power_abs (power_point)=0 to make it unnecessary to calculate this point when making the next interference. Then, de-spread results of all signals at this point are calculated with the smart antenna algorithm on the power_point as is shown with formula (6):

$$S_{ca+1,k}(d)=\sum_{i=1}^{N}h_{i,k}^{*}\sum_{q=1}^{Q}S_i((d-1)Q+q)C_{q,k}\text{pn\_code}(l)+S_{ca,k}(d) \tag{6}$$

where $C_{q,k}$ is a $k^{th}$ user spread spectrum code, pn_code(l) is a scramble code, $S_{ca,k}(d)$ is an interference cancellation result of the prior time, initial value $S_{0,k}(d)=0$ and output $S_{ca+1,k}(d)$ is symbolic level. Obviously, as users are not totally synchronized and there are severe multipath inference and white noise in the system, $S_{ca+1,k}(d)$ is a rough calculation initially.

$S_{ca+1,k}(d)$ is sent to a signal/noise ratio estimating module 224 and signal reconstructing module 222. The function of signal/noise ratio estimating module 224 is to estimate each user signal/noise ratio. The signal generated by signal generator 221 is a de-scrambled, de-spread and demodulated signal. Currently there are many methods to estimate each user signal/noise ratio. One such method is: for a $k_{th}$ user, calculates the power of the signal first, as shown with formula (7):

$$\text{power\_K}=\sum_{d=1}^{D}\text{abs}^2(S_k(d)) \tag{7}$$

If the power is greater than a certain threshold, then it is an effective power. For all the signals with an effective power, calculate its variance on a corresponding point of a constellation map. If the variance is greater than a preset value, then the signal/noise ratio of this user is comparatively low and its $S_{ca+1,k}(d)$ value is unbelievable, so interference cancellation is needed. If, however, the variance is less than the preset value, then the signal/noise ratio of this user is comparatively high and its $S_{ca+1,k}(d)$ value is believable, so interference cancellation is unneeded. The purpose of using the signal/noise ratio estimating module is to simplify the calculation of interference cancellation, as it is unnecessary to cancel interference for a believable signal.

Signal reconstructing module 222 uses $S_{ca+1,k}$(d) to reconstruct the original signal, which is chip level and shown with formula (8):

$$S_{ca+1,k}(Q(d-1)+q)=S_{ca+1,k}(d)C_{q,k}pn\_code\ (l) \quad (8)$$

Then, the method calculates components of K users on N antennas, as shown with formula (9):

$$S'_{ca+1,i}(n)=\sum_{k=1}^{K}S_{ca+1,k}(n)h_{i,k}^{*} \quad (9)$$

The recovered results of N antennas are sent to interference cancellation module 223 to cancel the interference, as shown with formula (10):

$$S_i(n)=S_i(n)-S'_{ca+1,i}(n) \quad (10)$$

In FIG. 2, the function of deciding module 225 is to decide when interference cancellation will be stopped with two deciding conditions: (1) the signal/noise ratio of all signals is greater than the set threshold, or (2) the numbers of loops of interference cancellations reaches a set number, which is less than or equal to the length of the search window and within this range the numbers of loops are decided by the processing capability of a digital signal processor, FPGA chip and the like. When either of the two conditions is satisfied, the processing procedure of the interference cancellation method of the smart antenna is ended and the recovered signal $S_{ca+1,k}$(d) is outputted.

Figure 3:
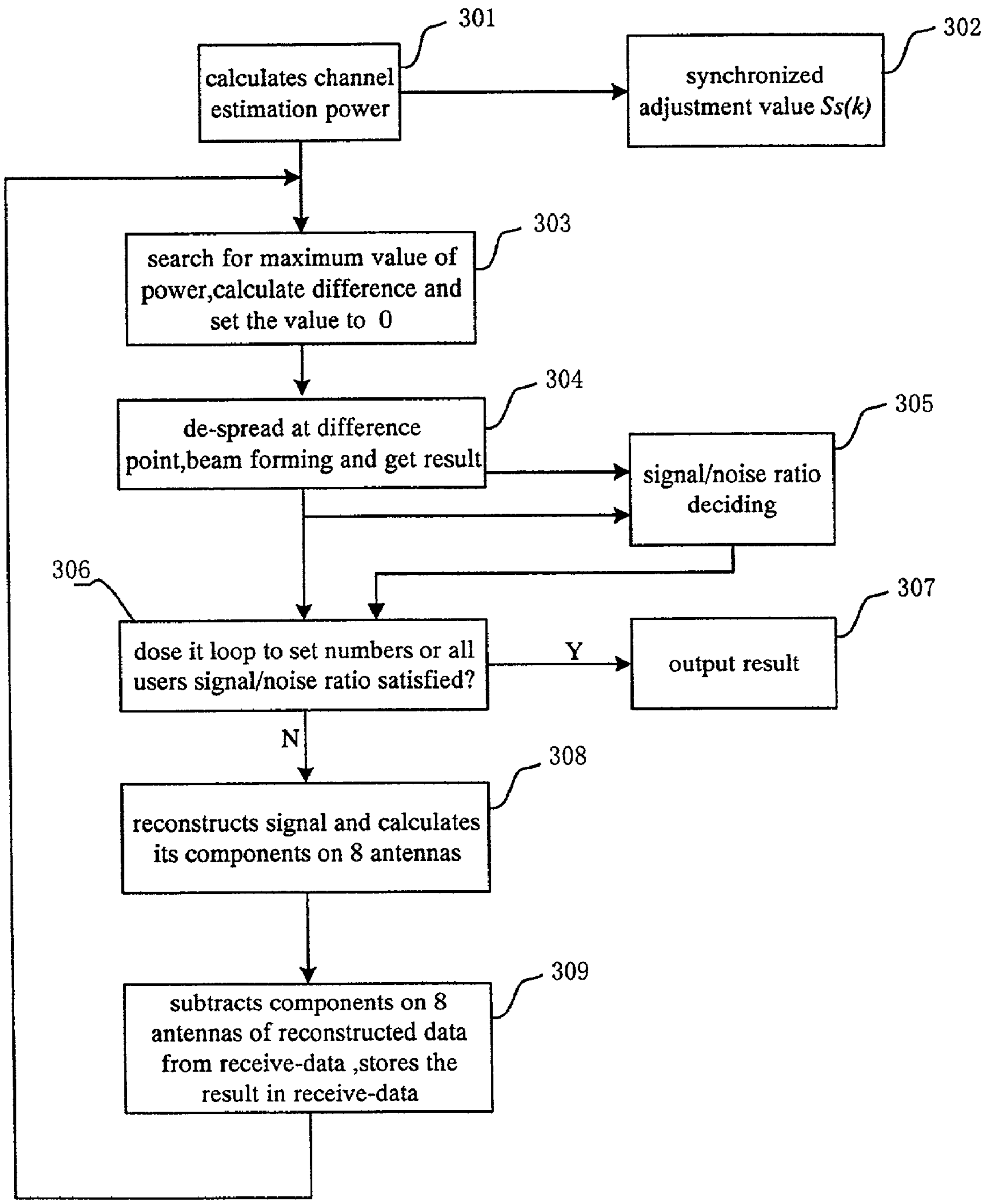
FIG. 3 is an implementing flow chart of smart antenna and interference cancellation method.

FIG. 3 illustrates 8 antennas (N=8) as an example to explain the processing procedure of the interference cancellation method for smart antennas.

Functional block 301 calculates a channel estimation power by power estimating module 220. Functional blocks 303 and 304 search for a maximum value of power by signal generator module 221, calculate the difference and set the value to 0, de-spread it at its difference point and make beam forming, then the result is sent, at the same time, to a signal/noise ratio decision module 225 and signal reconstructing module 222 (through decision module 225). Functional block 302 sends a synchronized adjustment value $S_S$(k). Functional block 308 reconstructs the signal and calculates its components on these 8 antennas. Functional block 309 subtracts components on 8 antennas of reconstructed data from the receive_data, stores the result in receive_data, and then functional block 303 to functional block 309 is executed repeatedly. When functional block 305 decides the magnitude of signal/noise ratio by signal/noise ratio decision module 224, and functional block 306 decides, by decision module 225, that the numbers of loops have reached a set value or all users signal/noise ratio has been satisfied, then interference cancellation is ended and functional block 307 outputs the recovered signals.

The invention is particularly useful for CDMA wireless communication systems, including time division duplex (TDD) and frequency division duplex (FDD) CDMA wireless communication systems. One skilled in the art of wireless communication systems, having knowledge of smart antenna principles and digital signal processing, can use method of the invention to design a high-qualified smart antenna system, which can be used on various mobile communication or wireless user loop systems with high performance.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed is:

1. A baseband processing method based on smart antenna and interference cancellation for a communication system including one or more antenna units linked to one or more corresponding radio frequency transceivers which are linked to a baseband processor, where each antenna unit comprises k user channels, wherein k is a natural number, and the baseband processing method comprises the steps of:

A. obtaining a sampled-data output signal from each antenna unit and said corresponding radio frequency transceivers, estimating k user channels for each antenna unit based on said sampled-data output signal using a predetermined user training sequence, and obtaining k user responses for each antenna unit from said estimated user channels;

B. calculating a main path and a multipath power distribution for each user channel of all antenna units within a searching window, calculating each user maximum peak value power position based on the calculated power distribution, storing the calculated peak value power position in a power point, and obtaining de-spread results of all signals at the power point with a smart antenna algorithm;

C. reconstructing the de-spread results, adding a scramble code, and then obtaining a chip level reconstructed signal;

D. subtracting the reconstructed signals from said sampled-data output signals; and E. repeating steps B to D until recovering all user signals.

2. The method according to claim 1, wherein said user responses are stored as a matrix, which is correlated to an individual user's training sequence and is calculated and stored beforehand.

3. The method according to claim 1, wherein the step of calculating the main path and multipath power distribution for each user channel of all antenna units within the searching window, comprises:

estimating a power response for each user channel of all antenna units within the searching window, calculating a sum for the power response of all user channels, setting the calculated peak value power with 0, and not calculating the calculated peak value power position again when making the next interference cancellation.

4. The method according to claim 1, further comprising sending an adjustment parameter for synchronization to a transmitting module associated with a user its most powerful path is not at the same point of other users and which is not synchronized with a base station while calculating each user's maximum peak value power position.

5. The method according to claim 1, wherein step B further comprises:

estimating a signal/noise ratio for all users based on the de-spread result, repeating steps C, D, and E for users identified as having a low signal/noise ratio; and outputting a signal result directly for users identified as having a high signal/noise ratio.

6. The method according to claim 5, wherein the step of estimating a user signal/noise ratio comprises:

calculating a user power;

determining whether the calculated user power is greater than a selected threshold so as to determine whether the calculated user power is an effective power;

calculating the variance for all signals having an effective power at their corresponding constellation map point; and identifying those users having a low signal/noise ratio when the variance is greater than a preset value, and identifying those users having a high signal/noise ratio when the variance is less than said preset value.

7. The method according to claim 1, wherein step C comprises reconstructing the useful symbolic level signals and calculating components of all users signal and multipaths on each antenna unit.

8. The method according to claim 1, wherein step D is executed using an interference cancellation module.

9. The method according to claim 1, wherein step E comprises repeating, until a number of interference cancellation loops reaches a preset number, which preset number is less or equal to length of a search window, at which time interference cancellation is stopped and the recovered signals are output.

10. The method according to claim 1, wherein step E comprises repeating, until the signal/noise ratio of all signals is greater than a predetermined threshold, at which time interference cancellation is stopped and the recovered signals are output.

11. The method according to claim 1, wherein step E comprises repeating steps B to D for at most a number of times equal to the length of searching window.

12. The method according to claim 1, wherein a channel estimation module estimates the user channels in step A.

13. The method according to claim 1, wherein a power estimation module estimates the power response, the main path and multipath power distribution, and a signal generator receives the calculated power distribution and generates the useful symbolic level signals.

14. The method according to claim 5, wherein a signal/noise ratio estimation module that receiving the de-spread result estimates the signal/noise ratio.

15. The method according to claim 1, wherein a signal reconstructing module reconstructs the reconstructed signals.

16. The method according to claim 1, wherein step E is executed by a decision module.

17. A baseband processor based on smart antenna and interference cancellation for a communication system including one or more antenna units linked to one or more corresponding radio frequency transceivers which are linked to the baseband processor, where each antenna unit comprises k user channels, wherein the baseband processor comprises:

a channel estimation module each estimating k user channels for a sampled-data output signal from the radio frequency transceiver; and a smart antenna interference cancellation module for receiving user responses from each channel estimation module and the sampled-data output signals from each radio frequency transceiver, repeating the follows until recovering all user signals;

calculating the main path and multipath power distribution for all user channels of all antenna units within the searching window; calculating each user maximum peak value power position based on the calculated power distribution, storing the calculated peak value power position in a power point, and obtaining de-spread results of all signals at the power point with a smart antenna algorithm;

reconstructing the de-spread results, adding a scramble code, and then obtaining a chip level reconstructed signal; and subtracting the reconstructed signals from said sampled-data output signals.

18. The baseband processor according to claim 17, wherein the smart antenna interference cancellation module comprises:

a power estimation module, receiving user responses from the channel estimation module, estimating a power response for each user channel of all antenna units, calculating a sum for the power response of all user channels;

a signal generator, receiving the calculated power distribution from the power estimation module, the user responses from the channel estimation module, interference cancellation results and the sampled-data output signals, calculating each user maximum peak value power position, storing the calculated peak value power position in a power point and obtaining de-spread results of all signals at the power point with a smart antenna algorithm;

a signal reconstructing module, reconstructing de-spread results from the signal generator and calculating components of all users signal and multipaths on each antenna unit to obtain a chip level reconstructed signal;

an interference cancellation module, receiving the sampled-data output signals and the reconstructed signals from the signal reconstructing module, subtracting the reconstructed signals from the sampled-data output signals to obtain the interference cancellation results sending to the signal generator; and a decision module, determining whether a number of interference cancellation loops reaches a preset number, which preset number is less or equal to length of a search window; if so, instructing the signal generator to stop interference cancellation and output recovered signals.

19. The baseband processor according to claim 18, wherein the smart antenna interference cancellation module further comprises:

a signal/noise ratio estimation module, estimating a signal/noise for the de-spread results from the signal generator, outputting recovered signals directly for users identified as having a high signal/noise ratio; instructing the signal generator to continue interference cancellation for users identified as having a low signal/noise ratio.

20. The baseband processor according to claim 18, wherein the power estimation module further comprises sending an adjustment parameter for synchronization to a transmitting module associated with a user its most powerful path is not at the same point of other users and which is not synchronized with a base station while calculating each user's maximum peak value power position.

* * * * *